US012772554B2

(12) United States Patent
Lee et al.

(10) Patent No.: US 12,772,554 B2
(45) Date of Patent: Oct. 20, 2026

(54) INSERTION LAYER BETWEEN CHANNEL AND PASSIVATION FOR TRANSISTOR

(71) Applicant: Taiwan Semiconductor Manufacturing Company, Ltd., Hsinchu (TW)

(72) Inventors: I-Che Lee, Taipei City (TW); Wei-Gang Chiu, New Taipei City (TW); Pin-Ju Chen, Hsinchu City (TW); Huai-Ying Huang, Jhonghe City (TW); Yen-Chieh Huang, Changhua County (TW); Kai-Wen Cheng, Taichung City (TW); Yu-Ming Lin, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 391 days.

(21) Appl. No.: 18/490,893

(22) Filed: Oct. 20, 2023

(65) Prior Publication Data

US 2025/0133820 A1 Apr. 24, 2025

(51) Int. Cl.
*H10D 62/13* (2025.01)
*H10D 30/01* (2025.01)
(Continued)

(52) U.S. Cl.
CPC ....... *H10D 84/853* (2025.01); *H10D 30/0316* (2025.01); *H10D 30/6211* (2025.01);
(Continued)

(58) Field of Classification Search
CPC ........... H10D 30/0316; H10D 30/6732; H10D 62/021; H10D 62/13; H10D 84/853;
(Continued)

(56) References Cited

U.S. PATENT DOCUMENTS

| | | | | |
|---|---|---|---|---|
| 6,246,070 B1 * | 6/2001 | Yamazaki | .......... | H10D 86/0251 257/E29.294 |
| 9,515,093 B2 * | 12/2016 | Xun | .................. | H10D 30/0321 |

(Continued)

OTHER PUBLICATIONS

Nomura et al. "Highly stable amorphous In—Ga—Zn—O thin-film transistors produced by eliminating deep subgap defects" Appl. Phys. Lett. 99, 053505 (2011); doi: 10.1063/1.3622121, published on Aug. 5, 2011.

(Continued)

*Primary Examiner* — Eduardo A Rodela
(74) *Attorney, Agent, or Firm* — Eschweiler & Potashnik, LLC

(57) ABSTRACT

In some embodiments, the present disclosure relates to an integrated device, including a substrate; a gate overlying the substrate; a channel layer separated from the gate by a dielectric and overlying the gate; source/drain regions on the channel layer, the gate extending between the source/drain regions; an insertion layer conforming to an upper surface of the channel layer and comprising a first material; and a passivation layer conforming to an upper surface of the insertion layer and comprising a second material different from the first material; where the passivation layer has a higher density than the insertion layer, such that the passivation layer mitigates the diffusion of environmental materials towards the channel layer, and where the insertion layer mitigates the diffusion of the second material from the passivation layer into the channel layer.

20 Claims, 10 Drawing Sheets

(51) Int. Cl.
*H10D 30/62* (2025.01)
*H10D 62/00* (2025.01)
*H10D 64/01* (2025.01)
*H10D 84/85* (2025.01)

(52) U.S. Cl.
CPC ........... *H10D 62/021* (2025.01); *H10D 62/13* (2025.01); *H10D 62/154* (2025.01); *H10D 62/158* (2025.01); *H10D 64/021* (2025.01)

(58) Field of Classification Search
CPC ............. H10D 30/6211; H10D 62/154; H10D 62/158; H10D 64/021; H10D 30/6704; H10D 30/6755
See application file for complete search history.

(56) References Cited

U.S. PATENT DOCUMENTS

| | | | | |
|---|---|---|---|---|
| 12,232,352 | B2 * | 2/2025 | Yoon | H10K 59/122 |
| 12,238,913 | B2 * | 2/2025 | Sharma | H01L 25/18 |
| 2011/0008930 | A1 | 1/2011 | Sasaki et al. | |
| 2016/0300954 | A1 * | 10/2016 | Sasaki | H01L 21/02252 |
| 2023/0200131 | A1 * | 6/2023 | Park | H10K 59/12<br>257/40 |

OTHER PUBLICATIONS

Li et al. "Effect of reactive sputtered SiOx passivation layer on the stability of InGaZnO thin film transistors" Vacuum 86 (2012) 1840e1843, published in 2012.

Choi et al. "Effect of Deposition Temperature of SiOx Passivation Layer on the Electrical Performance of a—IGZO TFTs" IEEE Electron Device Letters ( vol. 33, Issue: 3, Mar. 2012), published on Feb. 10, 2012.

Kang et al. "Effect of SiO and/or SiN Passivation Layer on Thermal Stability of Self-Aligned Coplanar Amorphous Indium-Gallium-Zinc-Oxide Thin-Film Transistors" Journal of Display Technology ( vol. 9, Issue: 9, Sep. 2013), published on Feb. 25, 2013.

* cited by examiner

500

INSERTION LAYER BETWEEN CHANNEL AND PASSIVATION FOR TRANSISTOR

BACKGROUND

Many modern day electronic devices include transistors. Transistors have source/drain regions, a gate, and a channel extending between the source/drain regions. A conductive path is formed between the source/drain regions through the channel based on the biasing of the gate. Transistors may be formed through front end of line (FEOL) processes of back end of line (BEOL) processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
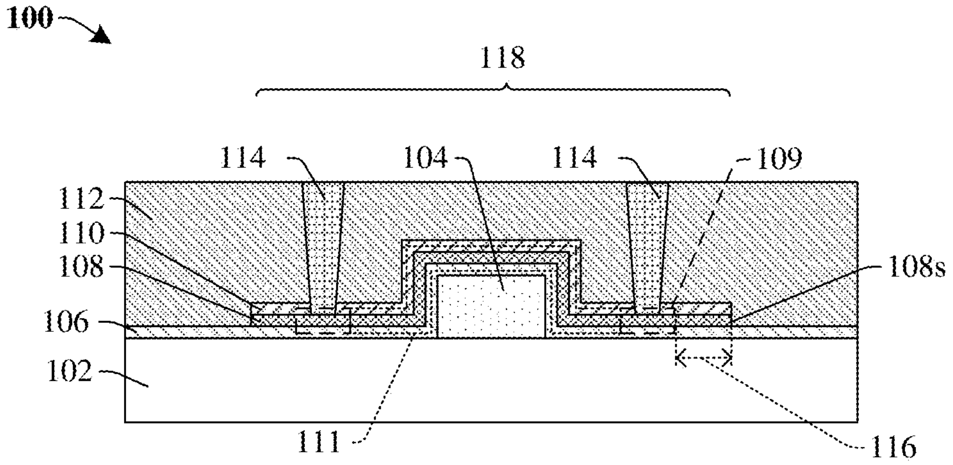
FIG. 1 illustrates a cross-sectional view of some embodiments of a transistor having an insertion layer between the channel and the passivation layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Random-access-memory (RAM) devices comprise a selector transistor and a capacitor. A three dimensionally (3-D) stacked dynamic RAM device typically arranges a plurality of selector transistors in a layer with a plurality of capacitors vertically offset from the layer. The transistors may be formed in either a FEOL or a BEOL process. Biasing the transistors results in a charge transferring to or from the capacitors, forming a device that has multiple states that can be read at a later time.

In some selector transistors, a passivation layer overlies the channel layer, protecting the channel layer from the diffusion of gasses (e.g., hydrogen gas ($H_2$), oxygen gas ($O_2$), and water vapor ($H_2O$) from the ambient environment into the device. This diffusion would result in degradation of the channel performance by increasing the resistance of the channel, or altering the threshold voltage of the transistor in undesirable ways. However, a number of problems arise when common materials such as silicon dioxide ($SiO_2$) and aluminum oxide ($Al_2O_3$) are used for the passivation layer.

When silicon dioxide ($SiO_2$) is used for the passivation layer, gasses from the ambient environment may readily permeate through the silicon dioxide ($SiO_2$) layer due to its relatively low density compared to metal oxides. This permeability results in a passivation layer with a high thickness being used to substantially mitigate the diffusion of gasses into the channel layer. This increased thickness raises both the material cost and the time spent to form the device.

When aluminum oxide ($Al_2O_3$) or other metal oxides are used for the passivation layer, a lower thickness may be used than the silicon dioxide ($SiO_2$) to mitigate the diffusion of gases towards the channel layer. This results in part from the aluminum oxide ($Al_2O_3$) having a greater density than the silicon dioxide ($SiO_2$). However, the direct interface between the aluminum oxide ($Al_2O_3$) passivation layer and the channel layer results in intermixing of the aluminum (Al) of the passivation layer and materials of the channel layer, altering the properties of the channel and reducing the performance of the transistor. This issue also occurs in other metal oxides with a direct interface between the metal oxide passivation layer and the channel layer. A transistor that limits the diffusion of ambient gases as the metal oxide embodiment does while also mitigating the diffusion of materials from the metal oxide to the channel layer is desirable.

The present disclosure provides a transistor having an insertion layer between the passivation layer and the channel layer. The insertion layer greatly mitigates the intermixing of the materials of the passivation layer and the channel layer, while the passivation layer may mitigate the diffusion of gasses from the ambient environment to the channel layer. The reduction in impurities in the channel layer from both the atmospheric gases and the passivation layer results in the channel layer having less variance in its properties and increasing the performance of the channel.

FIG. 1 illustrates a cross-sectional view 100 of some embodiments of a transistor having an insertion layer between the channel and the passivation layer.

A gate 104 overlies a substrate 102. The gate 104 is covered by a dielectric 106, which extends across an upper surface of the substrate 102. A channel layer 108 overlies the dielectric 106. The channel layer 108 extends over the gate 104 and has an uppermost surface overlying the gate 104. In some embodiments, the channel layer 108 has two additional upper surfaces extending at a substantially equal depth beneath the uppermost surface of the channel layer 108. The channel layer 108 further comprises source/drain regions 109 on opposite sides of the gate 104. Source/drain contacts 114 are coupled to the source/drain regions 109. And active region 111 of the channel layer 108 extends between the source/drain regions 109.

During operation, current flows between the source/drain contacts 114 via the source/drain regions 109 and the active region 111 when the device is in an "ON" state, and current does not flow through the active region 111 when the device is in an "OFF" state. A bias voltage at the gate 104 determines the state of the device based on a threshold voltage. In some embodiments, when the bias voltage is greater than the threshold voltage, the device is in an "ON" state, and when the bias voltage is less than the threshold voltage, the device is in an "OFF" state. The threshold voltage is affected by the composition and properties of the channel layer 108 in the active region 111.

Upper surfaces of the channel layer 108 are covered by an insertion layer 110, which in some cases is referred to as a first insulative layer. In some embodiments, the insertion layer 110 is or comprises an insulative material such as silicon dioxide ($SiO_2$). A passivation layer 112 overlies the insertion layer 110 and covers the transistor 118. In some embodiments, the passivation layer 112 is or comprises a metal oxide such as aluminum oxide ($Al_2O_3$), hafnium oxide ($Hf_2O_3$), or the like. A material of the passivation layer 112 has a greater density than a material of the insertion layer 110, resulting in the passivation layer 112 being more effective at blocking atmospheric gases (e.g., hydrogen gas ($H_2$), oxygen gas ($O_2$), and water vapor ($H_2O$)) from reaching the channel layer 108 and altering the channel properties. However, the material of the passivation layer 112 may also intermix with a material of the channel layer 108 where the passivation layer 112 and the channel layer 108 are in contact, altering the channel properties. The insertion layer 110 is directly between upper surfaces of the channel layer 108 and the passivation layer 112, mitigating the amount of intermixing between the material of the passivation layer 112 and the material of the channel layer 108. The intermixing is mitigated by the physical separation of the channel layer 108 from the passivation layer 112. In some embodiments, the intermixing is further mitigated by properties of the material of the insertion layer 110.

In some embodiments, the channel layer 108 directly contacts the passivation layer 112 at outermost sidewalls of the channel layer 108, and outermost sidewalls of the channel layer 108 are aligned with outer sidewalls of the insertion layer 110. While the material of the passivation layer 112 may diffuse into the channel layer 108 from the outermost sidewalls, the outermost sidewalls are spaced 116 from the active region 111, lowering the amount the material may diffuse into the active region 111. The active region 111, being the component most sensitive to change due to the intermixing of the material of the passivation layer, is spaced from the outermost sidewalls of the channel layer 108. Therefore, while intermixing may occur at an outer region at the outermost sidewall, and portions of the channel layer 108 may have a higher concentration of the material of the passivation layer 112, the active region maintains a substantially lower concentration of the material of the passivation layer 112. This lower concentration further mitigates the effects the intermixing may have on the device, as the portions of the channel layer with the greatest concentration of the material of the passivation layer 112 are spaced from the active region 111.

Figure 2:
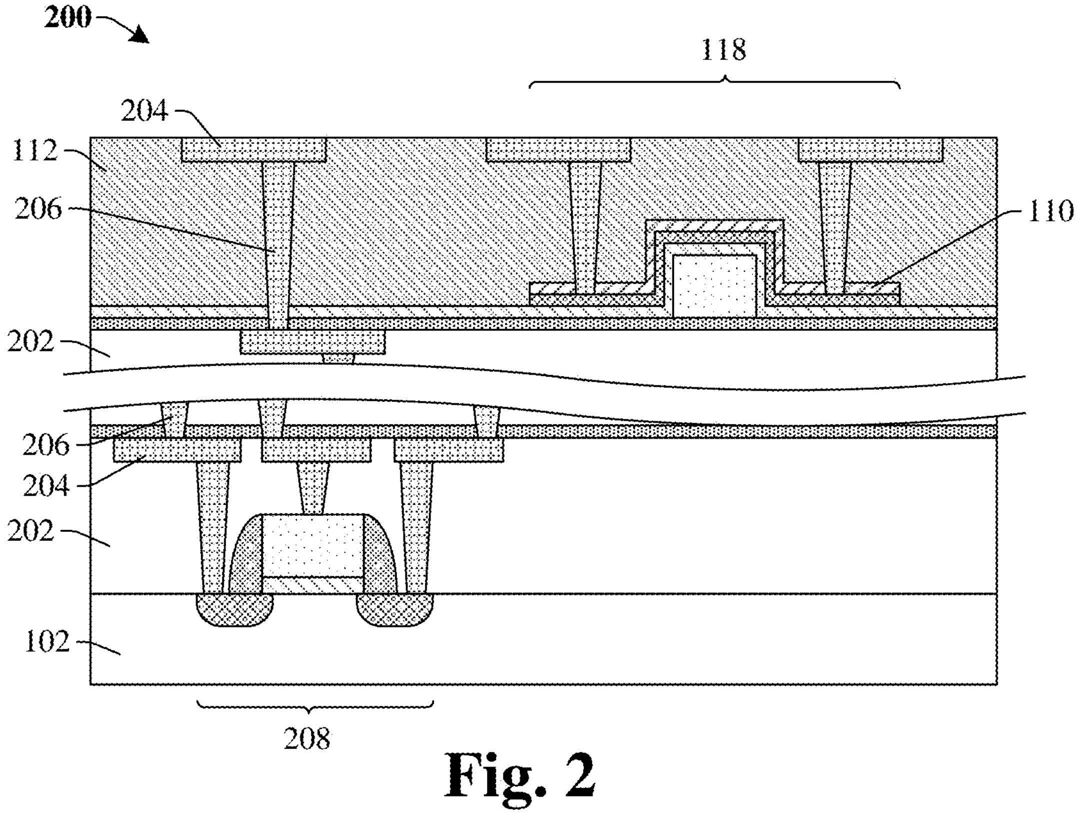
FIG. 2 illustrates a cross-sectional view of some embodiments of a transistor having an insertion layer between the channel and the passivation layer formed in a BEOL process.

FIG. 2 illustrates a cross-sectional view 200 of some embodiments of a transistor having an insertion layer between the channel and the passivation layer formed in a BEOL process.

In some embodiments, a plurality of interlayer dielectrics 202 separate the transistor 118 from the substrate 102. One or more wire layers 204 and one or more via layers 206 extend through the plurality of interlayer dielectrics 202 and the passivation layer 112. In further embodiments, a plurality of semiconductor devices 208 are on the substrate 102 and are coupled to the one or more wire layers 204. The insertion layer 110 may conform to transistors 118 on the substrate 102 or on an interlayer dielectric 202 over the substrate 102.

Figure 3:
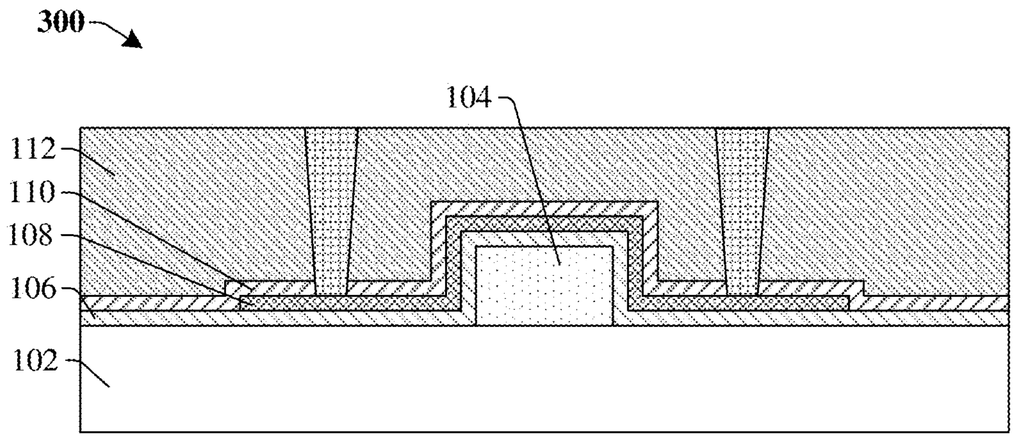
FIG. 3 illustrates a cross-sectional view of some alternative embodiments of a transistor having an insertion layer between the channel and the passivation layer.

FIG. 3 illustrates a cross-sectional view 300 of some alternative embodiments of a transistor having an insertion layer between the channel and the passivation layer.

In some embodiments, the insertion layer 110 extends past outermost sidewalls of the channel layer 108. The insertion layer 110 spaces outer sidewalls of the channel layer 108 from the passivation layer 112 and extends across an upper surface of the dielectric 106. Separating the channel layer 108 from the passivation layer 112 further reduces the concentration of the material of the passivation layer 112 in the channel layer 108, further mitigating the effects of the intermixing by reducing the amount of intermixing. Further, the passivation layer 112 is separated from the dielectric 106 by the insertion layer 110.

The insertion layer 110 has a first thickness measured between a lower surface of the insertion layer 110 and an upper surface of the insertion layer 110 directly above the lower surface. In some embodiments, the first thickness is between approximately 10 angstroms and 200 angstroms, between approximately 15 angstroms and 250 angstroms, between approximately 5 angstroms and 120 angstroms, or within another, similar range. The passivation layer 112 has a second thickness measured between a lower surface of the passivation layer 112 directly above the uppermost surface of the insertion layer 110, and the uppermost surface of the passivation layer 112. In some embodiments, the second thickness is between approximately 10 angstroms and 1000 angstroms, between approximately 15 angstroms and 1250 angstroms, between approximately 5 angstroms and 800 angstroms, or within another, similar range.

Figure 4:
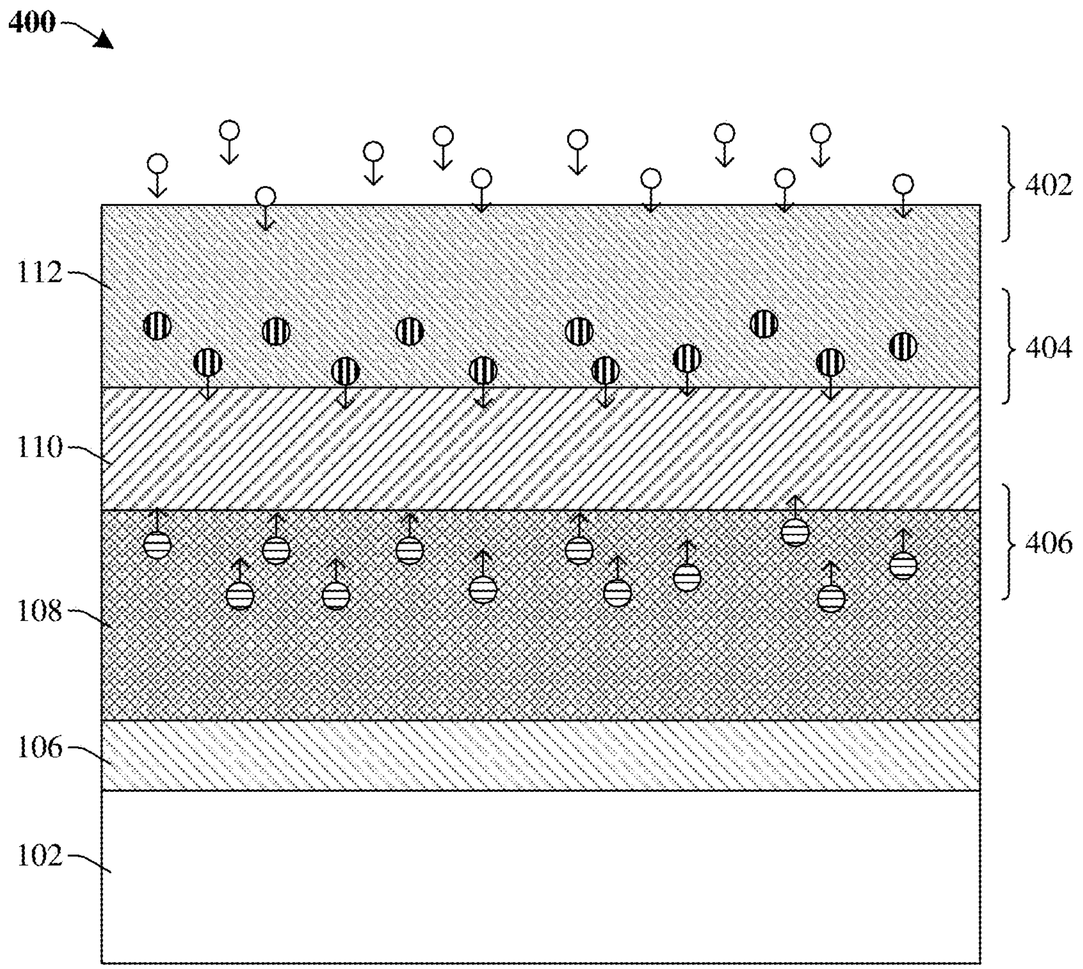
FIG. 4 illustrates a cross-sectional view of the intermixing of elements from the channel layer, the passivation layer, and the ambient environment.

FIG. 4 illustrates a cross-sectional view 400 of the intermixing of elements from the channel layer, the passivation layer, and the ambient environment.

As shown, atmospheric gases 402 (e.g., hydrogen gas ($H_2$), oxygen gas ($O_2$), water vapor ($H_2O$) and the like) enter the passivation layer 112 from an exposed surface or a subsequently added layer. Due to the density of the materials 404 of the passivation layer 112 (e.g., metal oxides) creating a medium that the atmospheric gases do not easily permeate, the diffusion of the atmospheric gases 402 through the passivation layer 112 to the channel layer 108 is greatly reduced compared to passivation layers of similar thicknesses made of, for example, silicon dioxide ($SiO_2$).

The material 404 of the passivation layer 112, further, intermixes with the material 406 of the insertion layer 110. The insertion layer 110 mitigates the intermixing of the material 404 of the passivation layer 112 with the material 406 of the channel layer 108 by spacing the two layers and acting as a barrier to the transfer of the materials 404, 406. Further, the insertion layer 110, when comprising silicon dioxide ($SiO_2$), has a stabilizing effect on the materials 404, 406 (e.g., metals) that intermix within the insertion layer 110. This stabilizing effect further mitigates the intermixing of the material 406 of the channel layer 108 and the material 404 of the passivation layer 112.

Figure 5:
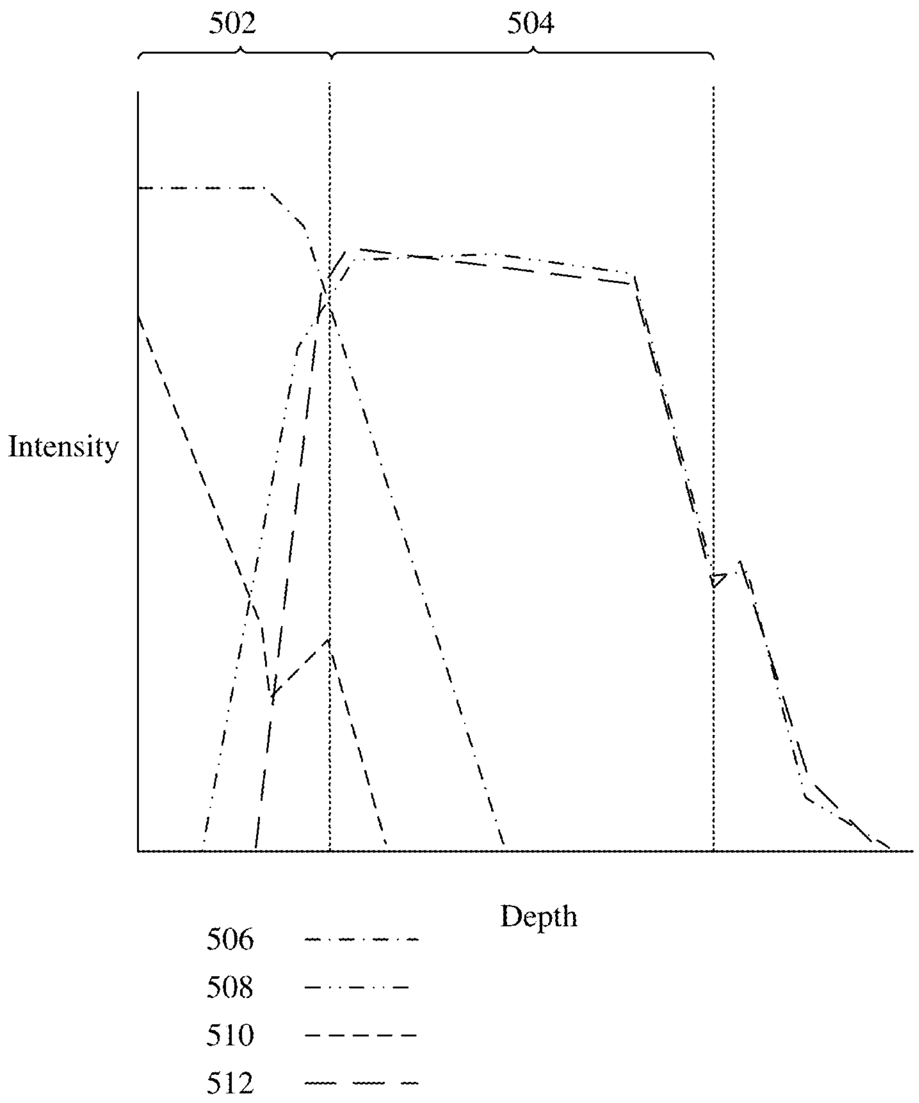
FIG. 5 illustrates a graph of the intensity of the spectra corresponding to aluminum and gallium at the surface of the channel layer in some embodiments.

FIG. 5 illustrates a graph 500 of the intensity of the spectra of aluminum and gallium at the surface of the channel layer in some embodiments.

The graph 500 is divided into a first portion 502 and a second portion 504. The second portion 504 corresponds to the channel layer (see 108 of FIG. 1). The first portion 502 corresponds to the layer directly above the channel layer (see 108 of FIG. 1). Line 506 corresponds to the intensity of the spectra corresponding to aluminum in an embodiment where the passivation layer (112 of FIG. 1) directly contacts the channel layer (108 of FIG. 1). Line 508 corresponds to the intensity of the spectra corresponding to gallium in an embodiment where the passivation layer (112 of FIG. 1) directly contacts the channel layer. Line 510 corresponds to the intensity of the spectra corresponding to aluminum in an embodiment where the insertion layer (110 of FIG. 1) is between the passivation layer (112 of FIG. 1) and the channel layer (108 of FIG. 1). Line 512 corresponds to the intensity of the spectra corresponding to gallium in an embodiment where the insertion layer (110 of FIG. 1) is between the passivation layer (112 of FIG. 1) and the channel layer (108 of FIG. 1). The relative intensity of lines 506, 508, 510, 512 is proportional to an intensity of the spectra of the elements at varying depths in the device as may be measured by secondary ion mass spectroscopy (SIMS) techniques.

In embodiments without an insertion layer (see 110 of FIG. 1) between the passivation layer (see 112 of FIG. 1) and the channel layer (see 108 of FIG. 1), the first portion 502 corresponds to the passivation layer (112 of FIG. 1). Further, the intensity of the spectra corresponding to aluminum extending into the second portion in an embodiment without the insertion layer (shown by line 506) is significantly greater than the intensity of the spectra corresponding to aluminum extending into the second portion in an embodiment with the insertion layer (shown by line 510).

An atomic concentration of aluminum in an embodiment without the insertion layer (110 of FIG. 1) and an embodiment with the insertion layer (110 of FIG. 1) at the depths shown in FIG. 5 are proportional to the intensity of the spectra corresponding to aluminum. That is, the atomic concentration of aluminum extending into the second portion 504 in an embodiment without the insertion layer (110 of FIG. 1) is significantly greater than the atomic concentration of aluminum extending into the second portion 504 in an embodiment with the insertion layer (110 of FIG. 1).

Further, the intensity of the spectra corresponding to gallium in an embodiment without the insertion layer (shown by line 508) extending into the first portion 502 from the second portion 504 is significantly greater at larger distances from the surface of the channel layer (108 of FIG. 1) than the intensity of the spectra corresponding to gallium in an embodiment with the insertion layer (shown by line 512). That is, the gallium from the channel layer (108 of FIG. 1) extends further into an adjoining layer when the adjoining layer is the passivation layer (e.g., a metal oxide) instead of the insertion layer (e.g., silicon dioxide ($SiO_2$). The addition of the insertion layer (110 of FIG. 1) therefore both reduces the intermixing of metal from the passivation layer into the channel layer and further reduces the intermixing of gallium into the neighboring layer, resulting in a sharper difference between the channel layer and the adjoining layer. The greater contrast between layers preserves the expected channel properties of the channel layer (108 of FIG. 1) and results in a device with improved performance.

The atomic concentration of gallium in an embodiment without the insertion layer (110 of FIG. 1) and an embodiment with the insertion layer (110 of FIG. 1) at the depths shown in FIG. 5 are proportional to the intensity of the spectra corresponding to gallium. That is, the atomic concentration of gallium extending into the first portion 502 in an embodiment without the insertion layer (110 of FIG. 1) is significantly greater at larger distances from the second portion 504 than the atomic concentration of gallium extending into the first portion 502 in an embodiment with the insertion layer (110 of FIG. 1).

Figure 6:
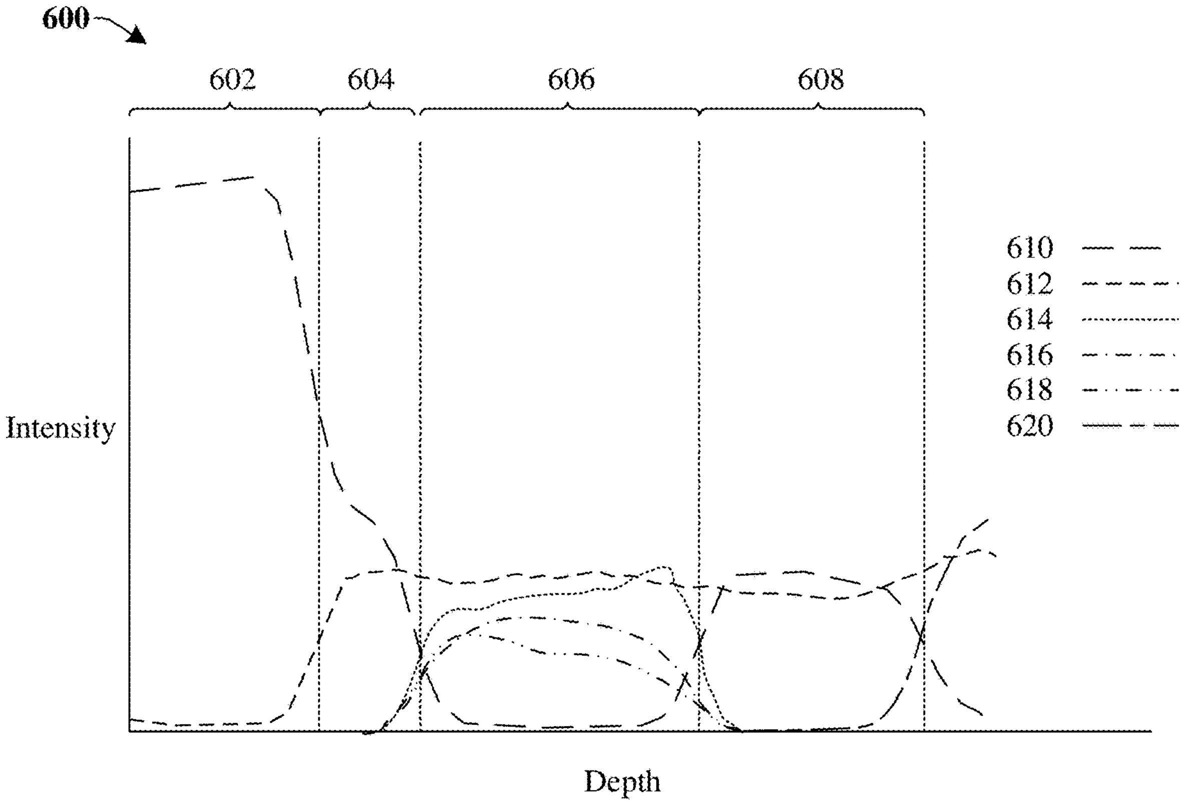
FIG. 6. illustrates a graph of the normalized absolute intensity of the spectra corresponding to various elements in the substrate, dielectric, channel layer, insertion layer, and passivation layer in some embodiments.

FIG. 6. illustrates a graph 600 of the normalized absolute intensity of the spectra corresponding to various elements in the substrate, dielectric, channel layer, insertion layer, and passivation layer in some embodiments.

As shown, the graph 600 is divided into four portions corresponding to different layers of the device. The first portion 602 corresponds to the substrate (102 of FIG. 1). The second portion 604 corresponds to the dielectric (106 of FIG. 1). The third portion 606 corresponds to the channel layer (108 of FIG. 1). The fourth portion 608 corresponds to the insertion layer (110 of FIG. 1). Line 610 corresponds to the intensity of the spectra corresponding to silicon in the layers of the transistor (118 of FIG. 1). Line 612 corresponds to the intensity of the spectra corresponding to oxygen. Line 614 corresponds to the intensity of the spectra corresponding to gallium. Line 616 corresponds to the intensity of the spectra corresponding to zinc. Line 618 corresponds to the intensity of the spectra corresponding to indium. Line 620 corresponds to the intensity of the spectra corresponding to aluminum. As shown, in some embodiments, the intensity of the spectra corresponding to gallium approaches zero when reading through the fourth portion 608 from the third portion 606 of the graph. Further, the intensity of the spectra corresponding to aluminum also approaches zero when reading from the end of the fourth portion 608 towards the third portion 606.

The intensity of the spectra shown in lines 610, 612, 614, 616, 618, 620 are proportional to the normalized absolute intensity of the emission spectra related to the elements corresponding to lines 610, 612, 614, 616, 618, 620, as may be measured by energy dispersive X-ray spectroscopy techniques. Further, atomic concentrations of the elements corresponding to lines 610, 612, 614, 616, 618, 620 are also proportional to the intensity of the spectra described in relation to FIG. 6. That is, in the first portion 602, the atomic concentration of silicon is greater than the atomic concentration of oxygen. Further, the atomic concentration of oxygen increases in the second portion 604, and is significantly greater than the atomic concentration of silicon in the third portion. Therefore, in some embodiments, the atomic concentration of gallium approaches zero when reading through the fourth portion 608 (corresponding to the insertion layer 110 of FIG. 1) from the third portion 606 of the graph. Further, the atomic concentration of aluminum also approaches zero when reading from the end of the fourth portion 608 towards the third portion 606.

FIGS. 7-14 illustrate cross-sectional views of some embodiments of a method of forming a transistor having an insertion layer between the channel and the passivation layer. Although FIGS. 7-14 are described in relation to a method, it will be appreciated that the structures disclosed in FIGS. 7-14 are not limited to such a method, but instead may stand alone as structures independent of the method.

Figure 7:
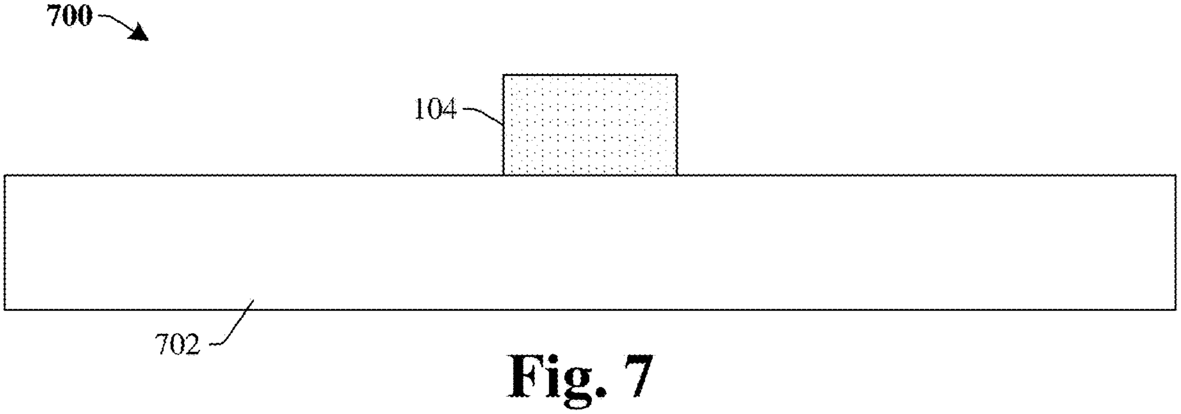
FIGS. 7-14 illustrate cross-sectional views of some embodiments of a method of forming a transistor having an insertion layer between the channel and the passivation layer.

As shown in cross-sectional view 700 of FIG. 7, an underlying layer 702 is provided. The underlying layer 702 may be either the substrate 102 or an interlayer dielectric of the plurality of interlayer dielectrics 202. A gate 104 is formed on the underlying layer 702. In some embodiments, the gate is or comprises a conductive material, such as copper (Cu), titanium (Ti), titanium nitride (TiN), doped polysilicon, or the like. In some embodiments, the gate 104 is formed using one of chemical vapor deposition (CVD), physical vapor deposition (PVD), atomic layer deposition (ALD), some other suitable deposition process combined with an etching process, a damascene process, or a combination of the foregoing.

Figure 8:
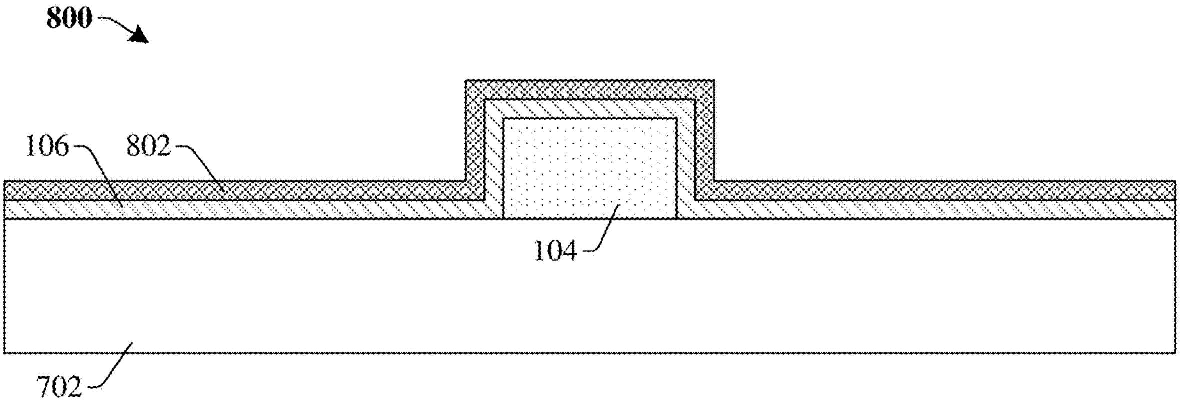

As shown in cross-sectional view 800 of FIG. 8, the dielectric 106 and a conformal channel layer 802 are formed over the gate 104. The dielectric 106 is formed using one of CVD, PVD, ALD, some other suitable deposition process, or a combination of the foregoing. The conformal channel layer is formed using one of CVD, PVD, ALD, some other suitable deposition process, or a combination of the foregoing. In some embodiments, the dielectric 106 is or comprises silicon dioxide ($SiO_2$), a high-k dielectric, or the like. In some embodiments, the channel layer comprises IGZO (InGaZnO), IZO (InZnO), gallium oxide ($Ga_2O_3$), indium oxide ($In_2O_3$), zinc oxide (ZnO), indium gallium oxide (InGaO), gallium zinc oxide (GaZnO), copper oxide ($Cu_2O$), tin dioxide ($SnO_2$), any combination of the foregoing, or the like.

Figure 9:
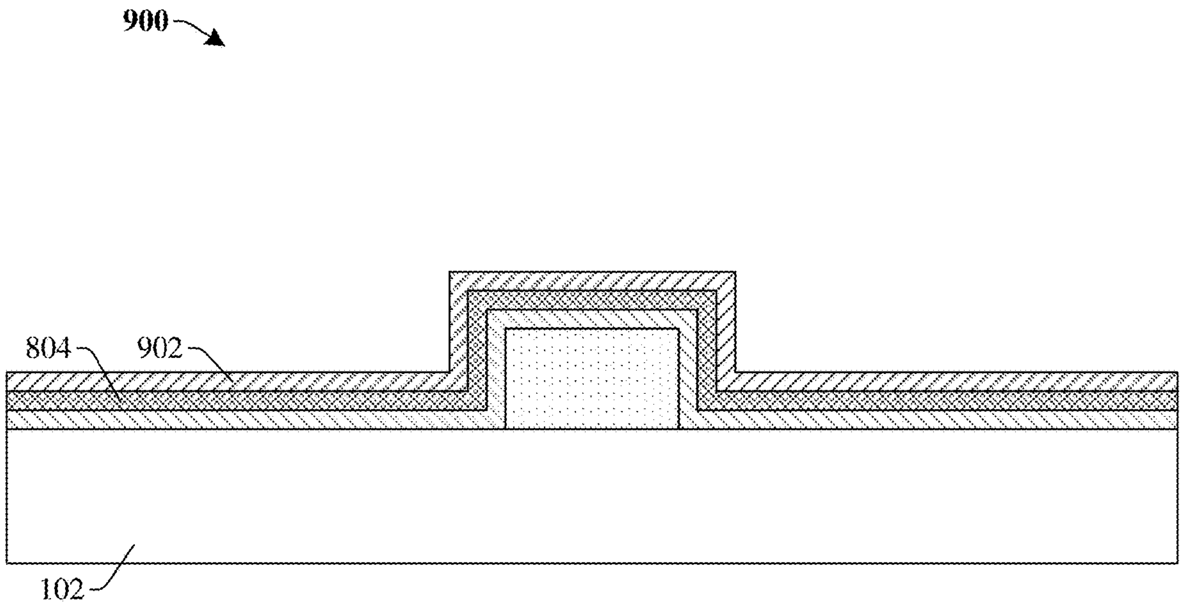

As shown in the cross-sectional view 900 of FIG. 9, a conformal insertion layer 902 is formed over the conformal channel layer 804. In some embodiments, the conformal insertion layer 902 may be deposited using one of CVD, PVD, ALD, some other suitable deposition process, or a combination of the foregoing. In some embodiments, the conformal insertion layer 902 is or comprises silicon dioxide ($SiO_2$) or the like.

Figure 10:
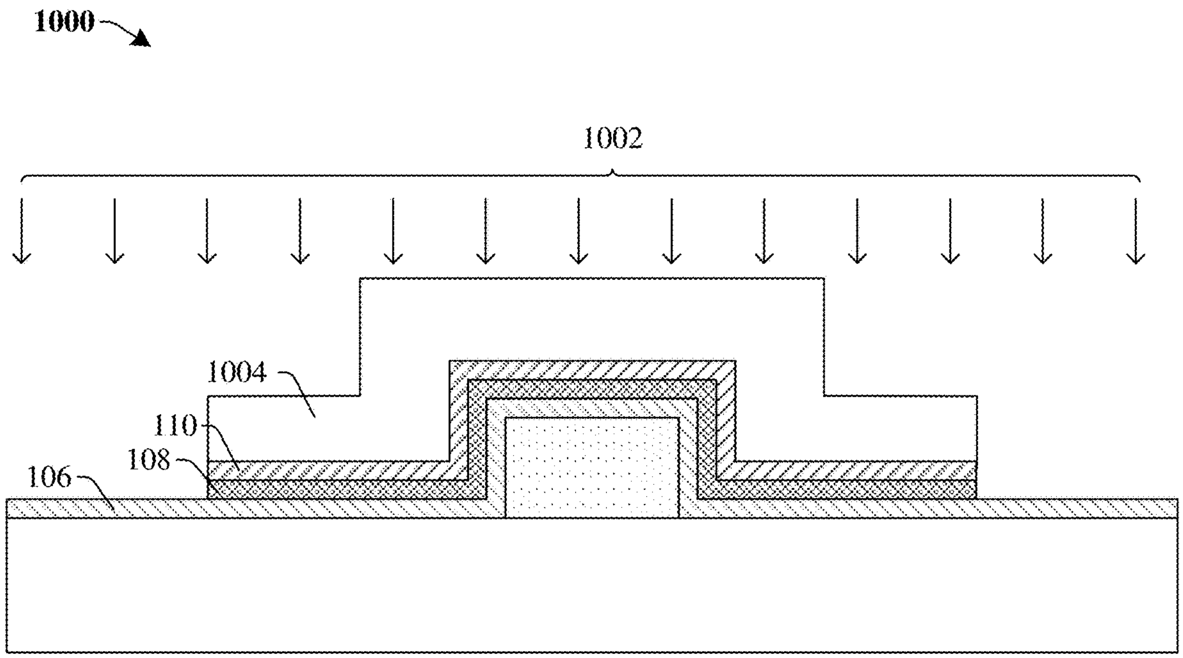

As shown in cross-sectional view 1000 of FIG. 10, a first masking layer 1004 is formed over a portion of the conformal insertion layer (see 902 of FIG. 9) corresponding to the area of the channel layer 108 to be formed hereafter. In some embodiments, the first masking layer 1004 is a photoresist and is patterned using photolithography. After the first masking layer 1004 is formed, one or more etching processes 1002 are performed, removing portions of the conformal insertion layer (see 902 of FIG. 9) and the conformal channel layer (see 804 of FIG. 9) corresponding to regions left exposed by the first masking layer 1004.

Figure 11:
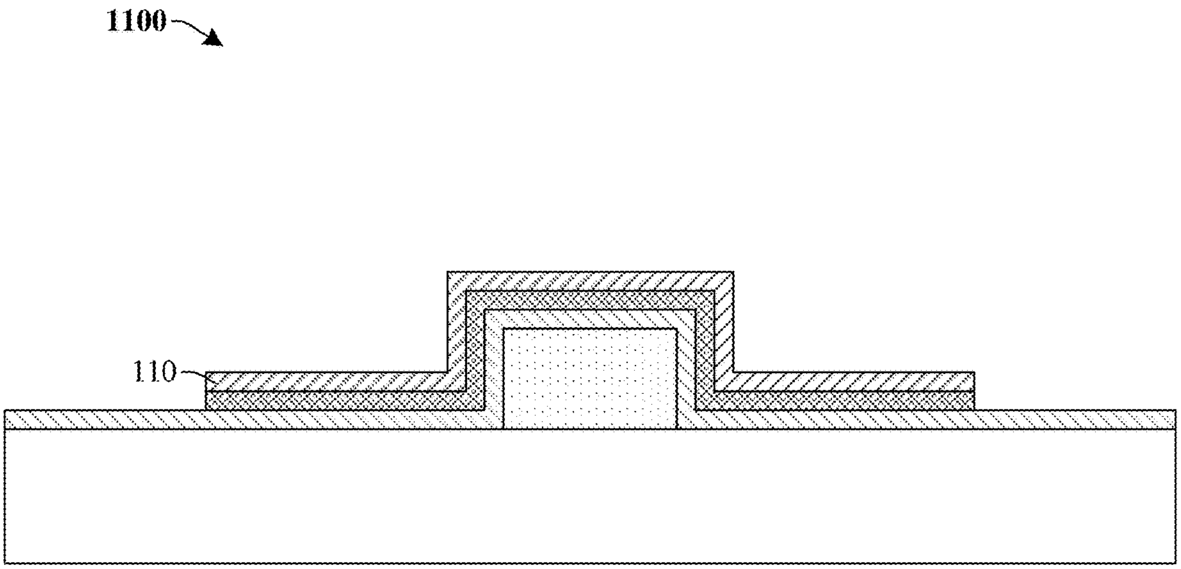

As shown in cross-sectional view 1100 of FIG. 11, the first masking layer (see 1004 of FIG. 10) is subsequently removed. The first masking layer (see 1004 of FIG. 10) may be removed using one of a stripping process, an ashing process, or the like.

Figure 12:
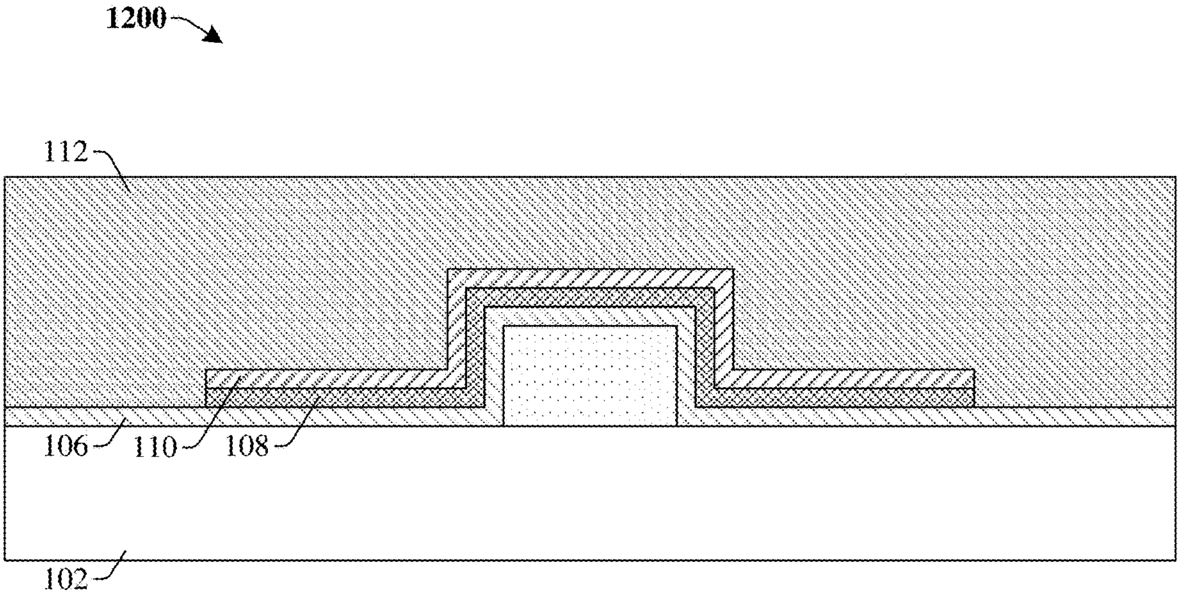

As shown in cross-sectional view 1200 of FIG. 12, The passivation layer 112 is formed over the insertion layer 110, the channel layer 108, and the dielectric 106. In some embodiments, the passivation layer 112 is or comprises a metal oxide (e.g., aluminum oxide ($Al_2O_3$), hafnium oxide ($Hf_2O_3$)) or the like. In some embodiments, the passivation layer 112 may be deposited using one of CVD, PVD, ALD, some other suitable deposition process, or a combination of the foregoing. In further embodiments, when the passivation layer is formed using a PVD process, ion bombardment from the PVD process leads to diffusion of a material of the passivation layer 112 into the insertion layer 110. The thickness of the insertion layer 110 mitigates the diffusion of the material into the channel layer 108, resulting in less impurities in the channel layer compared to embodiments without the insertion layer 110.

Figure 13:
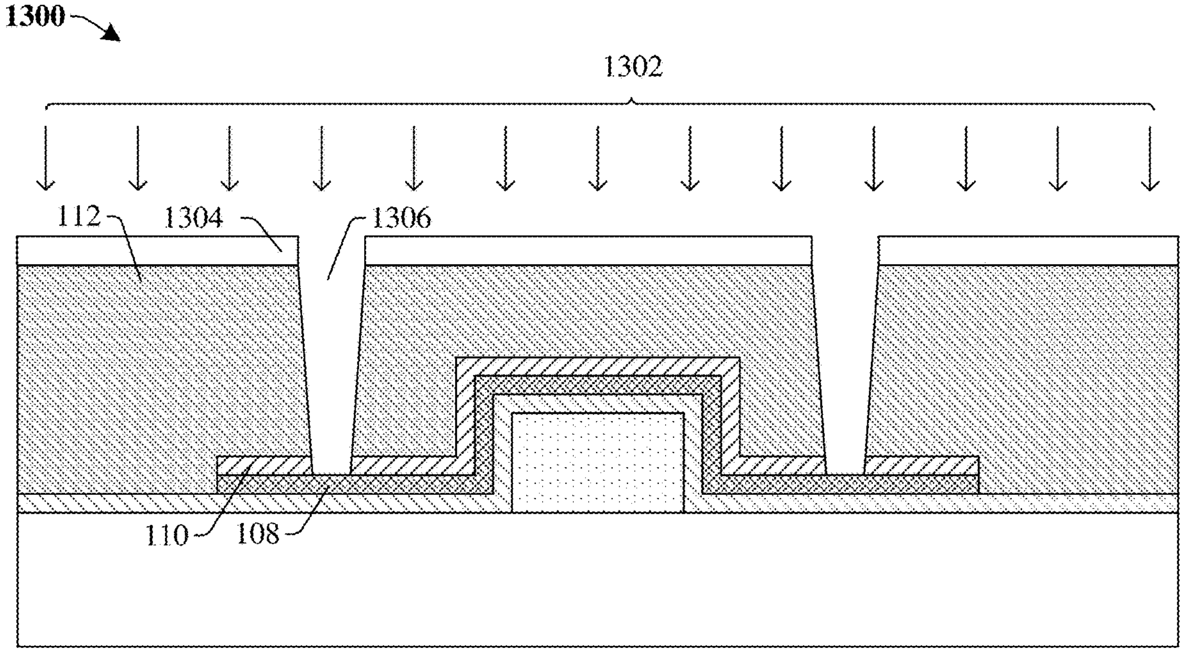

As shown in the cross-sectional view 1300 of FIG. 13, a second masking layer 1304 is formed over the passivation layer 112 and patterned. In some embodiments, the second masking layer 1304 is or comprises a photoresist, and is patterned using photolithography. After the second masking layer 1304 is formed, a second etching process 1302 is performed, removing portions of the passivation layer and insertion layer corresponding to the openings in the second masking layer 1304. The second etching process 1302 forms openings 1306. In some embodiments the second etching process is an anisotropic dry etching process. The second etching process stops at the channel layer 108, which acts as an etch stop layer.

Figure 14:
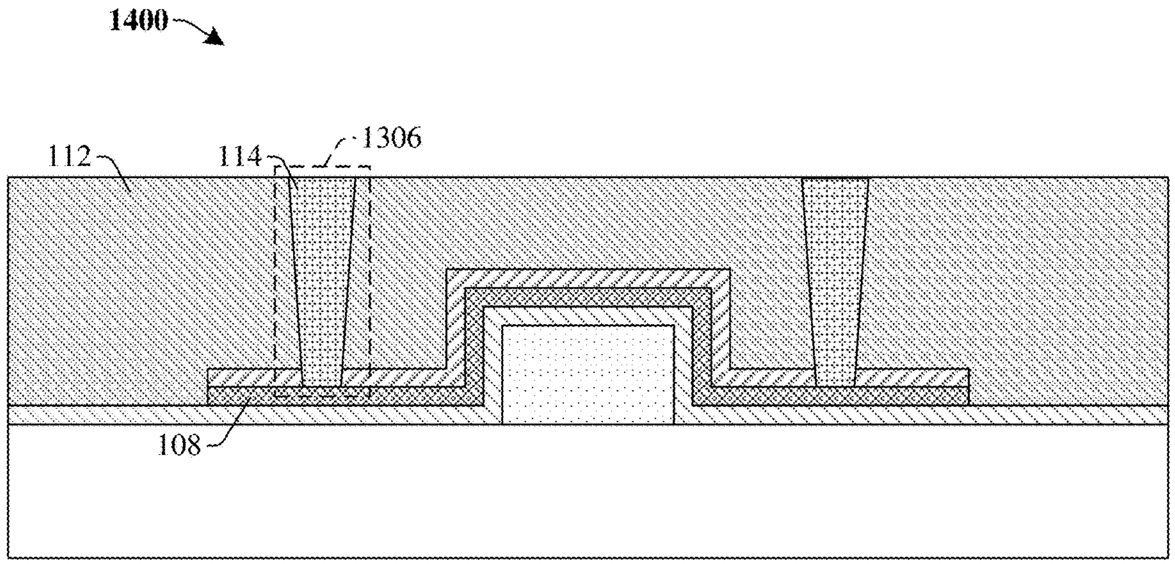

As shown in cross-sectional view 1400 of FIG. 14, source/drain contacts 114 are formed in the openings 1306 (shown in phantom). In some embodiments, the source/drain contacts 114 are or comprise copper (Cu), titanium (Ti), titanium nitride (TiN), or the like. The source/drain contacts are formed by depositing a conformal metal layer over the passivation layer 112, and subsequently performing a planarization process (e.g., a chemical mechanical planarization (CMP) process) to remove portions of the conformal metal layer overlying the passivation layer 112.

Figure 15:
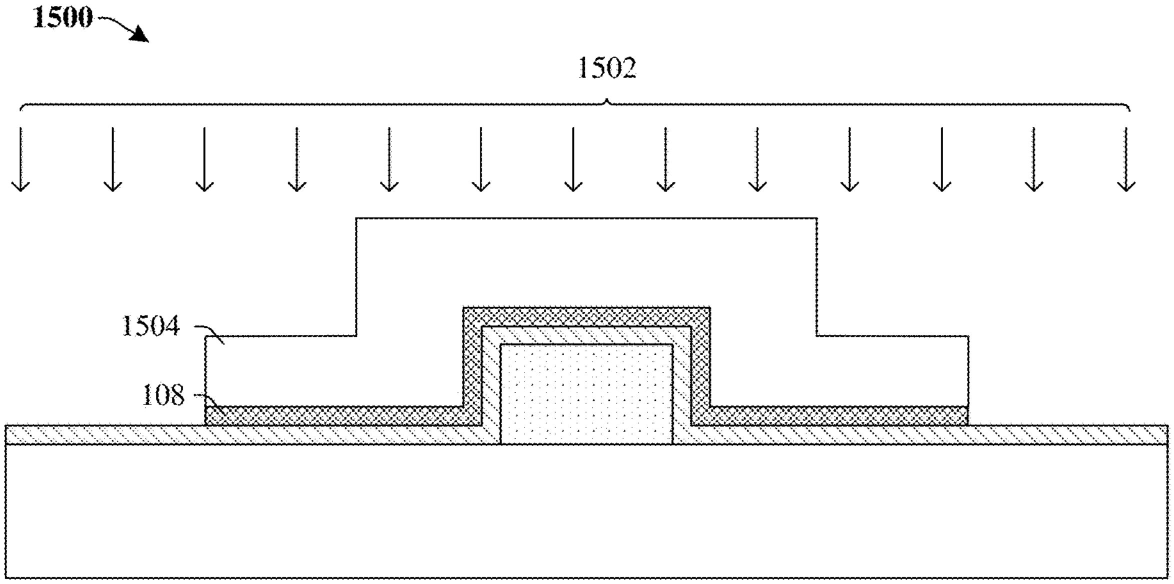
FIGS. 15-16 illustrate cross-sectional views of some embodiments of an alternative method of forming a channel layer and the insertion layer over the gate.
Figure 16:
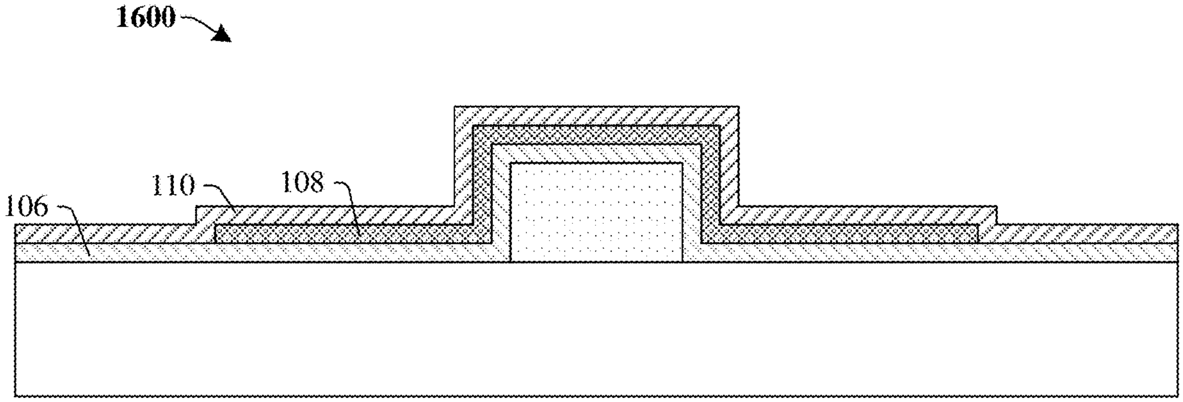

FIGS. 15-16 illustrate cross-sectional views of some embodiments of an alternative method of forming a channel layer and the insertion layer over the gate. The steps described in relation to FIGS. 9-10 may be replaced by the steps outlined below in relation to FIGS. 15-16 to form the embodiment described in relation to FIG. 3. Although FIGS. 15-16 are described in relation to a method, it will be appreciated that the structures disclosed in FIGS. 15-16 are not limited to such a method, but instead may stand alone as structures independent of the method.

As shown in cross-sectional view 1500 of FIG. 15, a third masking layer 1504 is formed over the conformal channel layer (see 802 of FIG. 8). In some embodiments, the third masking layer 1504 is or comprises a photoresist, and is patterned using photolithography. After the third masking layer 1504 is formed, a third etching process 1502 is performed. The third etching process 1502 results in portions of the conformal channel layer (see 802 of FIG. 8) corresponding to openings in the third masking layer 1504 being removed. After the third etching process 1502, the channel layer 108 remains beneath the third masking layer 1504. The third masking layer 1504 is subsequently removed.

As shown in cross-sectional view 1600 of FIG. 16, the insertion layer 110 is formed over the channel layer 108 and the dielectric 106. The insertion layer conforms to upper surfaces of the channel layer 108 and the dielectric 106, and covers outermost sidewalls of the channel layer 108.

Figure 17:
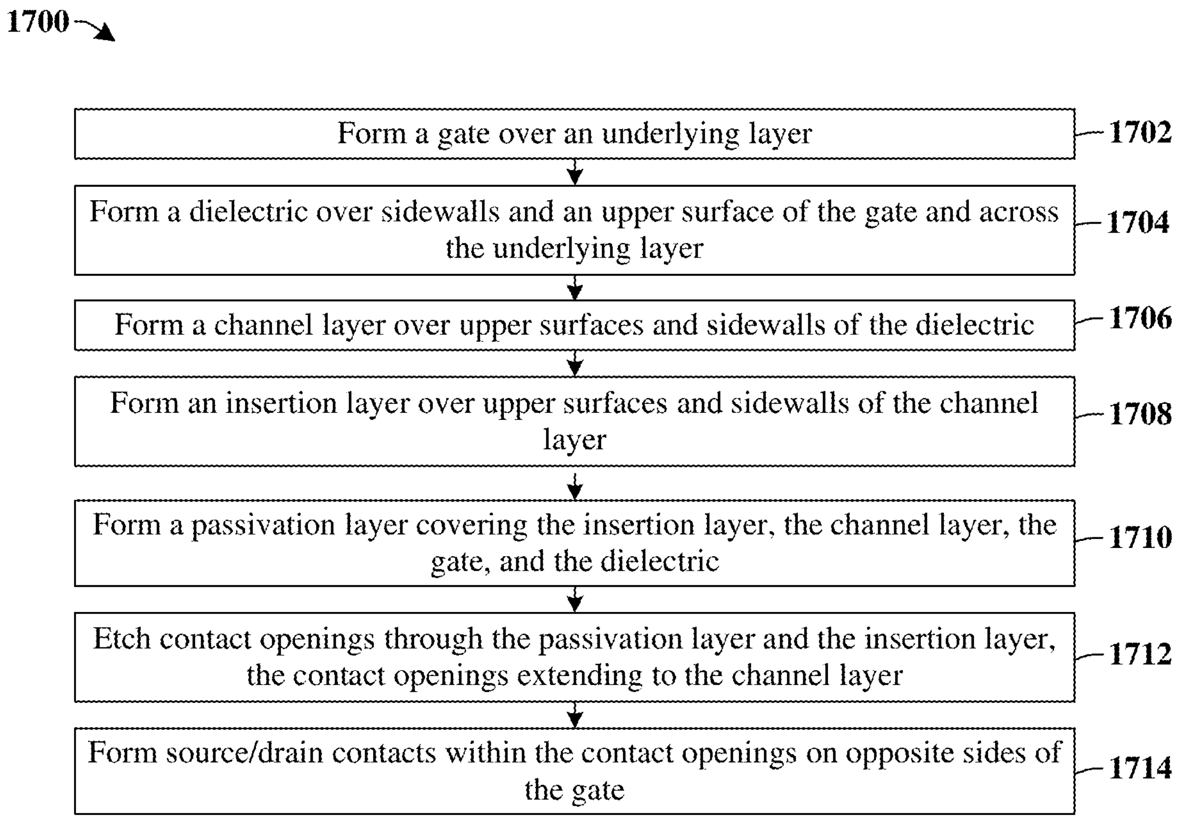
FIG. 17 illustrates a flow diagram of some embodiments of a method of forming a transistor having an insertion layer between the channel and the passivation layer.

FIG. 17 illustrates a flow diagram 1700 of some embodiments of a method of forming a transistor having an insertion layer between the channel and the passivation layer.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a gate is formed over an underlying layer. FIG. 7 illustrates a cross-sectional view 700 of some embodiments corresponding to act 1702.

At 1704, a dielectric is formed over sidewalls and an upper surface of the gate and across the underlying layer. FIG. 8 illustrate cross-sectional views 800 of some embodiments corresponding to act 1704.

At 1706, a channel layer is formed over upper surfaces and sidewalls of the dielectric. FIG. 8 illustrates a cross-sectional view 800 of some embodiments corresponding to act 1706.

At 1708, an insertion layer is formed over upper surfaces and sidewalls of the channel layer. FIGS. 9-10 illustrates cross-sectional views 900-1000 of some embodiments corresponding to act 1708.

At 1710, a passivation layer is formed over and covers the insertion layer, the channel layer, the gate, and the dielectric. FIG. 12 illustrates a cross-sectional view 1200 of some embodiments corresponding to act 1710.

At 1712, contact openings are etched through the passivation layer and the insertion layer, the contact openings extending to the channel layer. FIG. 13 illustrates a cross-sectional view 1300 of some embodiments corresponding to act 1712.

At 1714, source/drain contacts are formed within the contact openings on opposite sides of the gate. FIG. 14 illustrates a cross-sectional view 1400 of some embodiments corresponding to act 1714.

Therefore, the present disclosure relates to a new method of forming an integrated device having an insertion layer spacing upper surfaces of the channel layer from the passivation layer.

Accordingly, in some embodiments, the present disclosure relates to an integrated device, including a substrate; a gate overlying the substrate; a channel layer separated from the gate by a dielectric and overlying the gate; source/drain regions on the channel layer, the gate extending between the source/drain regions; an insertion layer conforming to an upper surface of the channel layer and comprising a first material; and a passivation layer conforming to an upper surface of the insertion layer and comprising a second material different from the first material; where the passivation layer has a higher density than the insertion layer, such that the passivation layer mitigates the diffusion of environmental materials towards the channel layer, and where the insertion layer mitigates the diffusion of the second material from the passivation layer into the channel layer.

In other embodiments, the present disclosure relates to an integrated device, including a gate overlying a substrate; a dielectric surrounding an upper surface and outer sidewalls of the gate; a channel layer surrounding upper surfaces and outer sidewalls of the dielectric; an insertion layer surrounding upper surfaces and outer sidewalls of the channel layer; and a passivation layer surrounding upper surfaces and outer sidewalls of the insertion layer, where the passivation layer and the dielectric extend past outermost sidewalls of the insertion layer, and where the insertion layer separates an uppermost surface of the channel layer from the passivation layer.

In yet other embodiments, the present disclosure relates to a method of forming an integrated device, including forming a gate over an underlying layer; forming a dielectric over sidewalls and an upper surface of the gate and across the underlying layer; forming a channel layer over upper surfaces and sidewalls of the dielectric; forming an insertion layer over upper surfaces and sidewalls of the channel layer; forming a passivation layer covering the insertion layer, the channel layer, the gate, and the dielectric; etching contact openings through the passivation layer and the insertion layer, the contact openings extending to the channel layer; and forming source/drain contacts within the contact openings on opposite sides of the gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated device, comprising:

a substrate;

a gate overlying the substrate;

a channel layer separated from the gate by a dielectric and overlying the gate;

source/drain regions within the channel layer, the gate extending between the source/drain regions;

an insertion layer conforming to an upper surface of the channel layer and comprising a first material;

a passivation layer conforming to an upper surface of the insertion layer and comprising a second material different from the first material, wherein the passivation layer has a higher density than the insertion layer, whereby the passivation layer mitigates diffusion of environmental materials towards the channel layer, and wherein the insertion layer mitigates diffusion of the second material from the passivation layer into the channel layer; and source/drain contacts extending through the passivation layer and the insertion layer to contact the source/drain regions at upper surfaces of the channel layer, wherein the source/drain contacts extend from a first height above a top surface of the insertion layer to a second height below a top surface of the gate and a lower surface of the channel layer.

2. The integrated device of claim 1, wherein the first material comprises silicon dioxide, the second material comprises aluminum, and the environmental materials comprise oxygen gas, hydrogen gas, and water vapor.

3. The integrated device of claim 1, wherein the channel layer conforms to outer sidewalls of the gate, and the insertion layer conforms to outer sidewalls of the channel layer.

4. The integrated device of claim 1, wherein the channel layer further comprises:

an active region between the source/drain contacts and covering the top surface and sidewalls of the gate, wherein the active region has a first concentration of the second material of the passivation layer; and outer regions spaced from the active region by the source/drain regions, wherein the outer regions are between the source/drain regions and outer sidewalls of the channel layer, and wherein the outer regions have a second concentration of the second material that is greater than the first concentration of the second material in the active region.

5. The integrated device of claim 1, wherein the insertion layer extends past outer sidewalls of the channel layer, and spaces outer sidewalls of the channel layer from the passivation layer.

6. The integrated device of claim 1, further comprising contacts extending to the source/drain regions of the channel layer, the contacts extending to an upper surface of the channel layer through the insertion layer and the passivation layer.

7. The integrated device of claim 1, wherein the channel layer has a first thickness, and the insertion layer has a second thickness that is greater than the first thickness.

8. The integrated device of claim 1, wherein the upper surface of the insertion layer is laterally spaced from the gate, and wherein the top surface of the gate is above the upper surface of the insertion layer and below a top surface of the channel layer.

9. The integrated device of claim 1, wherein sidewalls of the insertion layer extend from a first height level with the gate to a second height above the gate.

10. The integrated device of claim 1, wherein the lower surface of the channel layer is above the upper surface of the insertion layer.

11. An integrated device, comprising:

a gate overlying a substrate;

a dielectric surrounding an upper surface and outer sidewalls of the gate;

a channel layer surrounding upper surfaces and outer sidewalls of the dielectric;

an insertion layer surrounding upper surfaces and outer sidewalls of the channel layer, wherein upper surfaces of the insertion layer comprise an uppermost surface directly over the gate and two additional upper surfaces terminating at outermost sidewalls of the insertion layer, wherein the two additional upper surfaces are at a substantially equal depth beneath the uppermost surface;

a passivation layer surrounding the upper surfaces and outer sidewalls of the insertion layer, wherein the passivation layer and the dielectric extend past the outermost sidewalls of the insertion layer, and wherein the insertion layer separates an uppermost surface of the channel layer from the passivation layer; and source/drain contacts extending through the two additional upper surfaces to contact the channel layer and couple to source/drain regions in the channel layer, wherein the channel layer comprises an active region extending between the source/drain contacts, wherein the active region has a first concentration of a material from the passivation layer, and wherein an outer region of the channel layer at outermost sidewalls of the channel layer has a second concentration of the material from the passivation layer, where the second concentration is greater than the first concentration.

12. The integrated device of claim 11, wherein the insertion layer comprises a first material with a first density and the passivation layer comprises a second material with a second density, where the first density is less than the second density.

13. The integrated device of claim 12, wherein the second material diffuses into the insertion layer, wherein a third material of the channel layer diffuses into the insertion layer, and wherein the insertion layer mitigates diffusion of the second material into the channel layer and the third material into the passivation layer.

14. The integrated device of claim 11, further comprising:

a semiconductor device on the substrate beneath the gate; and a plurality of wire layers separating the semiconductor device and the gate.

15. A method of forming an integrated device, comprising:

forming a gate over an underlying layer;

forming a dielectric over sidewalls and an upper surface of the gate and across the underlying layer;

forming a channel layer over upper surfaces and sidewalls of the dielectric;

forming an insertion layer over upper surfaces and sidewalls of the channel layer;

forming a passivation layer covering the insertion layer, the channel layer, the gate, and the dielectric, wherein the passivation layer is formed using a physical vapor deposition process, and wherein ion bombardment from the physical vapor deposition process leads to diffusion of a material of the passivation layer into the insertion layer;

etching contact openings through the passivation layer and the insertion layer, the contact openings extending to the channel layer; and forming source/drain contacts within the contact openings on opposite sides of the gate.

16. The method of claim 15, further comprising:

etching the channel layer before forming the insertion layer, such that the insertion layer covers outermost sidewalls of the channel layer and contacts the dielectric.

17. The method of claim 15, further comprising:

etching the insertion layer and the channel layer before forming the passivation layer, wherein after the passivation layer is formed, the passivation layer covers outermost sidewalls of the insertion layer and the channel layer.

18. The method of claim 15, wherein the channel layer has a first upper surface on a first side of the gate and a second upper surface on a second side of the gate, and wherein the source/drain contacts are coupled to the first upper surface and the second upper surface.

19. The method of claim 15, wherein the dielectric extends past outermost sidewalls of the channel layer and separates the channel layer from the gate.

20. The method of claim 15, wherein after the contact openings are formed, the contact openings extend beneath the upper surface of the gate.

* * * * *